United States Patent
Hada et al.

(10) Patent No.: US 7,736,842 B2
(45) Date of Patent: Jun. 15, 2010

(54) RESIST COMPOSITION FOR ELECTRON BEAM OR EUV (EXTREME ULTRAVIOLET) AND METHOD FOR FORMING RESIST PATTERN

(75) Inventors: Hideo Hada, Kawasaki (JP); Daiju Shiono, Kawasaki (JP); Hiroo Kinoshita, Hyogo-ken (JP); Takeo Watanabe, Hyogo-ken (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 437 days.

(21) Appl. No.: 11/573,884

(22) PCT Filed: Sep. 1, 2005

(86) PCT No.: PCT/JP2005/016013
§ 371 (c)(1), (2), (4) Date: Feb. 16, 2007

(87) PCT Pub. No.: WO2006/027997
PCT Pub. Date: Mar. 16, 2006

(65) Prior Publication Data
US 2007/0269744 A1 Nov. 22, 2007

(30) Foreign Application Priority Data
Sep. 9, 2004 (JP) ............................. 2004-262488

(51) Int. Cl.
G03F 7/039 (2006.01)
G03F 7/20 (2006.01)
G03F 7/30 (2006.01)
G03F 7/38 (2006.01)

(52) U.S. Cl. .................. 430/326; 430/330; 430/919; 430/920; 430/921; 430/905; 430/910; 430/925; 430/942

(58) Field of Classification Search ................ None
See application file for complete search history.

(56) References Cited

U.S. PATENT DOCUMENTS

| | | | |
|---|---|---|---|
| 5,468,589 A | 11/1995 | Urano et al. | |
| 6,908,729 B2 | 6/2005 | Endo et al. | |
| 2001/0023050 A1 | 9/2001 | Numata et al. | |
| 2001/0038970 A1* | 11/2001 | Cameron et al. | 430/270.1 |
| 2001/0041300 A1 | 11/2001 | Kodama et al. | |
| 2002/0006578 A1 | 1/2002 | Kodama et al. | |
| 2003/0017425 A1 | 1/2003 | Endo et al. | |
| 2003/0148211 A1 | 8/2003 | Kamabuchi et al. | |
| 2004/0265733 A1* | 12/2004 | Houlihan et al. | 430/270.1 |
| 2005/0266336 A1* | 12/2005 | Kodama | 430/270.1 |

FOREIGN PATENT DOCUMENTS

| | | |
|---|---|---|
| EP | 1 566692 A1 | 8/2005 |
| JP | 04-039665 | 2/1992 |
| JP | 2001-215689 | 8/2001 |
| JP | 2001-281849 | 10/2001 |
| JP | 2001-330947 | 11/2001 |
| JP | 2003-171363 | 6/2003 |
| JP | 2003-177537 | 6/2003 |
| JP | 2003-231673 | 8/2003 |
| JP | 2003-287884 | 10/2003 |
| JP | 2003-307850 | 10/2003 |
| JP | 2004-085657 | 3/2004 |
| JP | 2005-172949 | 6/2005 |
| JP | 2005-173468 | 6/2005 |
| JP | 2005-196095 | 7/2005 |
| JP | 2005-221721 | 8/2005 |
| WO | WO 03/003120 | 1/2003 |
| WO | WO 03/107093 A2 * | 12/2003 |
| WO | WO 2004/002955 A2 | 1/2004 |

OTHER PUBLICATIONS

Office Action issued on Sep. 2, 2008 on the counterpart Japanese Patent Application No. 2004-262488.
European Search Report for the corresponding EP application No. 05781331.3, dated Oct. 10, 2007.
Date-stamped enclosure letter with the European Search Report.

* cited by examiner

*Primary Examiner*—Sin J. Lee
(74) *Attorney, Agent, or Firm*—Knobbe, Martens, Olson & Bear, LLP

(57) ABSTRACT

A resist composition for electron beam or extreme ultraviolet (EUV), comprising a resin component (A) which exhibits changed alkali solubility under action of acid, and a photoacid generator component (B) that generates acid on exposure, wherein the component (B) comprises at least one onium salt selected from the group consisting of onium salts having an anion represented by formula (b-0-1) or (b-0-2) shown below:

[Chemical Formula 1]

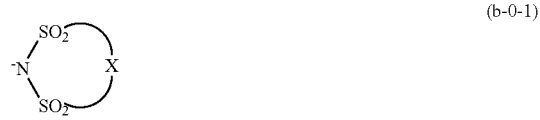

(b-0-1)

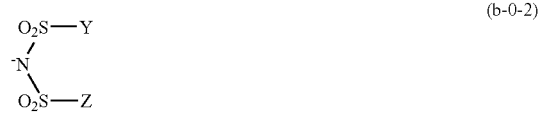

(b-0-2)

wherein X represents an alkylene group having 2 to 6 carbon atoms, in which at least one hydrogen atom is substituted with a fluorine atom; and each of Y and Z independently represents an alkyl group having 1 to 10 atoms, in which at least one hydrogen atom is substituted with a fluorine atom.

1 Claim, No Drawings

RESIST COMPOSITION FOR ELECTRON BEAM OR EUV (EXTREME ULTRAVIOLET) AND METHOD FOR FORMING RESIST PATTERN

RELATED APPLICATIONS

This application is the U.S. National Phase filing under 35 U.S.C. §371 of PCT/JP2005/016013, filed Sep. 1, 2005, which designated the United States and was published in a language other than English, which claims priority under 35 U.S.C. §119(a)-(d) to Japanese Patent Application No. 2004-262,488, filed Sep. 9, 2004. The content of these applications is incorporated herein by reference in their entireties.

TECHNICAL FIELD

The present invention relates to a resist composition for electron beam (EB) or extreme ultraviolet (EUV) and a method for forming a resist pattern, which are for use in EB lithography or EUV lithography.

BACKGROUND ART

In recent years, in the production of semiconductor elements and liquid crystal display elements, advances in lithography techniques have led to rapid progress in the field of miniaturization.

Typically, these miniaturization techniques involve shortening the wavelength of the exposure light source. Conventionally, ultraviolet radiation typified by g-line and i-line radiation has been used, but nowadays KrF excimer lasers and ArF excimer lasers are starting to be introduced in mass production of semiconductor devices. Moreover, recently, as a next generation technique for a lithography process using ArF excimer lasers (193 nm), lithography processes using EUV (extreme ultraviolet radiation; wavelength of approximately 13.5 nm) and electron beams have been proposed and researched (for example, see Patent Documents 1 to 3). Exposure with electron beam or EUV is generally conducted in a vacuum.

Further, in EUV lithography, due to a high degree of linearity of EUV, the exposure apparatus is generally constructed by employing a reflective optical system which uses a mirror such as a multilayer film mirror.

On the other hand, one example of a resist material which satisfies high resolution conditions required for reproducing patterns of minute dimensions is a chemically amplified resist, which includes a base material component with a film-forming capability, and an acid generator component that generates acid on exposure. Chemically amplified resists include negative compositions, which undergo a reduction in alkali solubility on exposure, and positive compositions, which display increased alkali solubility on exposure.

Presently, as a base component of a chemically amplified resist, a resin is used. For example, in a positive resist, a polyhydroxystyrene resin is used in which some of the hydroxyl groups are protected with acid dissociable, dissolution inhibiting groups, or a (meth)acrylic resin is used in which some of the carboxyl groups are protected with acid dissociable, dissolution inhibiting groups (for example, see Patent Documents 4 and 5).

In a process using electron beam or EUV, improvement of sensitivity is required from the viewpoint of throughput and the like.

Patent Document 1: Japanese Unexamined Patent Application, First Publication No. 2003-177537

Patent Document 2: Japanese Unexamined Patent Application, First Publication No. 2003-140361

Patent Document 3: Japanese Unexamined Patent Application, First Publication No. 2003-75998

Patent Document 4: Japanese Unexamined Patent Application, First Publication No. Hei 5-249682

Patent Document 5: Japanese Patent (Granted) Publication No. 2,881,969

DISCLOSURE OF THE INVENTION

Problems to be Solved by the Invention

However, when a conventional chemically amplified resist composition is applied to a lithography process using electron beam or EUV, sensitivity is unsatisfactory.

The present invention addresses the circumstances described above, with an object of providing a resist composition for use in a lithography process using electron beam or EUV and a method for forming a resist pattern, in which good sensitivity can be achieved.

Means for Solving the Problems

In order to achieve the above-mentioned object, the present invention employs the aspects described below.

A first aspect of the present invention is a resist composition for electron beam or EUV (extreme ultraviolet), comprising a resin component (A) which exhibits changed alkali solubility under action of acid, and an acid generator component (B) that generates acid on exposure, wherein the component (B) comprises at least one onium salt selected from the group consisting of onium salts having an anion represented by general formula (b-0-1) or (b-0-2) shown below:

[Chemical Formula 1]

wherein X represents an alkylene group having 2 to 6 carbon atoms, in which at least one hydrogen atom is substituted with a fluorine atom;

and each of Y and Z independently represents an alkyl group having 1 to 10 atoms, in which at least one hydrogen atom is substituted with a fluorine atom.

A second aspect of the present invention is a resist composition for electron beam or EUV (extreme ultraviolet), comprising a resin component (A) which exhibits changed alkali solubility under action of acid, and an acid generator component (B) that generates acid on exposure, wherein the component (B) comprises at least one sulfonium compound selected from the group consisting of sulfonium compounds represented by general formula (b-1) or (b-2) shown below:

[Chemical Formula 2]

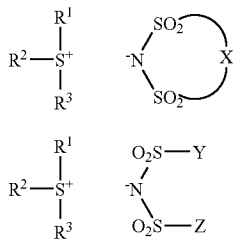

(b-1)

(b-2)

wherein X represents an alkylene group having 2 to 6 carbon atoms, in which at least one hydrogen atom is substituted with a fluorine atom;
each of Y and Z independently represents an alkyl group having 1 to 10 atoms, in which at least one hydrogen atom is substituted with a fluorine atom; each of $R^1$ to $R^3$ independently represents an alkyl group or an aryl group including or not including a substituent, with the proviso that at least one of $R^1$ to $R^3$ is an aryl group.

A third aspect of the present invention is a method for forming a resist pattern, comprising the steps of applying a resist composition of the present invention to a substrate, prebaking, conducting selective exposure or direct patterning with electron beam or extreme ultraviolet (EUV), conducting post-exposure baking (PEB), and performing alkali developing to form a resist pattern.

In this description, the term "exposure" is a concept including irradiation with an electron beam.

Effect of the Invention

By the present invention, a resist composition is provided for use in a lithography process using electron beam or EUV, as well as a method for forming a resist pattern, in which good sensitivity can be achieved.

BEST MODE FOR CARRYING OUT THE INVENTION

In the present invention, the term "(meth)acrylic acid" is a generic term that includes methacrylic acid and/or acrylic acid. The term "structural unit" refers to a monomer unit that contributes to the formation of a polymer. The term "structural unit derived from a (meth)acrylate ester" refers to a structural unit that is formed by the cleavage of the ethylenic double bond of a (meth)acrylate ester, and is hereafter frequently referred to as "(meth)acrylate structural unit".

[Resist Composition]

The resist composition of the present invention is a chemically amplified resist composition comprising a resin component (A) which exhibits changed alkali solubility under action of acid, and a photoacid generator component (B) that generates acid on exposure.

Component (A) is an alkali-soluble resin or a resin that can be converted to an alkali-soluble form. The former represents the so-called negative resist composition, and the latter represents the so-called positive resist composition.

In the case of a negative composition, the resist composition also contains a cross-linking agent as well as the component (B). Then, during formation of the resist pattern, when acid is generated from the component (B) by exposure, the action of this acid causes cross-linking to occur between the component (A) and the cross-linking agent, thereby causing the component (A) to become insoluble in alkali. As the cross-linking agent, typically an amino-based cross-linking agent such as a melamine resin, urea, or glycoluryl with methylol groups or alkoxylmethyl groups is used.

In the case of a positive composition, the component (A) is an alkali-insoluble resin that contains the so-called acid dissociable, dissolution inhibiting groups, and when acid is generated from the component (B) upon exposure, this acid causes the acid dissociable, dissolution inhibiting groups to dissociate, making the component (A) alkali soluble.

The resist composition of the present invention is preferably a positive composition.

<Component (A)>

In the present invention, there are no particular restrictions on the component (A), and any of the resins that have been proposed for conventional chemically amplified positive resist resins can be used.

Preferred examples of the component (A) include a resin component containing, as a main component, a resin (A-1) which satisfies the below-mentioned first requirement, and a resin component (A-2) which satisfies the below-mentioned second requirement. More preferred is a resin component (A-3) which contains a resin satisfying the above-mentioned first requirement as a main component, and which satisfies the above-mentioned second requirement.

In the present specification, a resin has a weight average molecular weight of 2,000 or more, in terms of polystyrene standards as measured by gel permeation chromatography (GPC), and includes not only polymers but also oligomers.

(A-1)

Firstly, component (A-1) is described.

First requirement: The main chain contains no quaternary carbon (a carbon atom having 4 carbon atoms bonded thereto).

As the component (A-1), for example, among the resins typically used for a chemically amplified-resist, one or more resins which contain no quaternary carbon in a main chain can be used. Herein, "a main chain" refers to the longest chain of a chain-like compound formed by bonding of monomers which constitute the resin.

Specific examples of resins which contain no quaternary carbon in the main chain include hydroxystyrene based resins, and resins containing structural units derived from acrylic esters, and these can be preferably used.

Examples of resins which contain quaternary carbon in the main chain include α-methylhydroxystyrene-based resins, and resins containing structural units derived from methacrylic esters.

In an exposure process using electron beam or EUV, due to radiation of high energy, it is presumed that cleavage of the main chain occurs easily in a resin containing quaternary carbon in the main chain.

Therefore, by constituting a resist composition with a resin (A-1) which contains no quaternary carbon in the main chain, it becomes possible to improve the photochemical stability of the resin against the radiation of electron beam or EUV, and, hence, it becomes possible to suppress occurrence of degassing during exposure, thereby preventing contamination in the exposure apparatus.

The component (A) may contain a resin other than the component (A-1) which exhibits changed alkali solubility under action of acid, as long as it is used in an amount such that the contamination of the inside of the exposure apparatus which occurs during a lithography process using electron beam or EUV does not practically cause any problems. However, it is preferred that the component (A) consists of the component (A-1).

In the component (A), the proportion of the component (A-1) as the main component is preferably 50% by weight or more, more preferably 70% by weight or more, still more preferably 90% by weight or more.

Resin Component of a First Example

Preferred examples of the component (A-1) include a positive resin (a resin component of a first example) containing the following structural units (a1) to (a4). This resin component exhibits increased alkali solubility under action of acid. In other words, under the action of the acid generated from the acid generator by exposure, cleavage occurs within the structural unit (a2) and the structural unit (a3), causing the resin, which was initially insoluble in alkali developing liquid, to increase alkali solubility.

As a result, by conducting exposure and then developing, a chemically amplified positive pattern can be formed.

Structural Unit (a1)

The structural unit (a1) is represented by general formula (I) shown below.

[Chemical Formula 3]

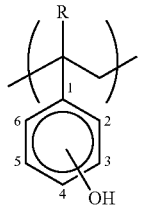

(I)

wherein R represents —H.

There are no particular restrictions on the position at which the —OH group is bonded to the benzene ring, although bonding at the position labeled 4 in the above formula (the para position) is preferred.

The structural unit (a1) typically accounts for 40 to 80 mol %, preferably from 50 to 75 mol % of the resin component. By ensuring a quantity of at least 40 mol %, the solubility in the alkali developing liquid can be improved and an improved pattern shape can also achieved. On the other hand, by ensuring a quantity of no more than 80 mol %, a better balance can be achieved with the other structural units.

Structural Unit (a2)

Structural unit (a2) is represented by general formula (II) shown below.

[Chemical Formula 4]

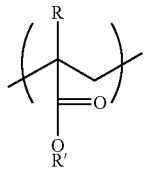

(II)

wherein R represents —H, and R' represents an acid dissociable, dissolution inhibiting group.

Examples of the acid dissociable, dissolution inhibiting group R' include alkyl groups with a tertiary carbon atom, wherein the tertiary carbon atom within the tertiary alkyl group is bonded to the ester group (—C(O)O—) shown in the formula (II), as well as cyclic acetal groups such as a tetrahydropyranyl group or a tetrahydrofuranyl group.

The acid dissociable, dissolution inhibiting group R' can also use other groups typically used in chemically amplified positive resist compositions.

Examples of preferred forms of the structural unit (a2) include those units represented by general formula (II-1) shown below.

[Chemical Formula 5]

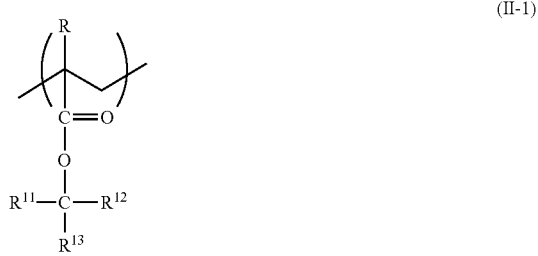

(II-1)

In this formula, R is as defined above, and each of $R^{11}$, $R^{12}$ and $R^{13}$ independently represents a lower alkyl group (which may be either a straight chain or a branched chain, and which preferably has 1 to 5 carbon atoms). Alternatively, two of $R^{11}$, $R^{12}$ and $R^{13}$ may be bonded together to form a monocyclic or polycyclic alicyclic group (in which the number of carbon atoms in the alicyclic group is preferably from 5 to 12). Furthermore, each of $R^{11}$ and $R^{12}$ may independently represent a lower alkyl group (which may be either a straight chain or a branched chain, and which preferably has from 1 to 5 carbon atoms), and $R^{13}$ may be bonded together to form a monocyclic or polycyclic alicyclic group (in which the number of carbon atoms in the alicyclic group is preferably from 5 to 12).

In those cases where an alicyclic group is not formed, a unit in which $R^{11}$, $R^{12}$ and $R^{13}$ each represents a methyl group is preferred.

In those cases where an alicyclic group is formed, then in the case of a monocyclic alicyclic group, units containing a cyclopentyl group or a cyclohexyl group are preferred.

In the case of a polycyclic alicyclic group, examples of preferred units include those represented by general formulas (II-2) and (II-3) shown below.

[Chemical Formula 6]

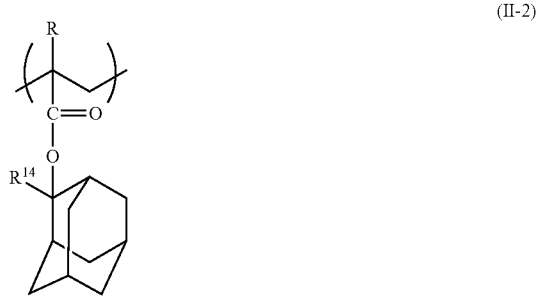

(II-2)

wherein R is as defined above, and $R^{14}$ represents a lower alkyl group (which may be either a straight chain or a branched chain, and which preferably has 1 to 5 carbon atoms);

[Chemical Formula 7]

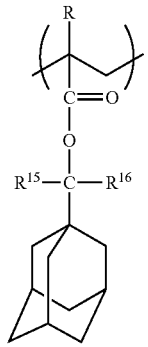

(II-3)

wherein R is as defined above, and each of $R^{15}$ and $R^{16}$ independently represents a lower alkyl group (which may be either a straight chain or a branched chain, and which preferably has 1 to 5 carbon atoms).

The structural unit (a2) typically accounts for 5 to 30 mol %, preferably from 10 to 20 mol %, of the resin component. By ensuring a quantity of at least 5 mol %, the alkali solubility after dissociation can be improved and an improved pattern shape can also achieved. On the other hand, by ensuring a quantity of no more than 30 mol %, a better balance can be achieved with the other structural units, so that it becomes easy to control the solubility of the resin in an alkali developing solution.

Structural Unit (a3)

Structural unit (a3) is represented by general formula (III) shown below.

[Chemical Formula 8]

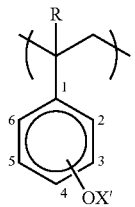

(III)

wherein R represents —H, and X' represents an acid dissociable, dissolution inhibiting group.

Examples of the acid dissociable, dissolution inhibiting group X' include tertiary alkyloxycarbonyl groups such as a tert-butyloxycarbonyl group or a tert-amyloxycarbonyl group; tertiary alkyloxycarbonylalkyl groups such as a tert-butyloxycarbonylmethyl group or a tert-butyloxycarbonylethyl group; tertiary alkyl groups such as a tert-butyl group or a tert-amyl group; cyclic acetal groups such as a tetrahydropyranyl group or a tetrahydrofuranyl group; and alkoxyalkyl groups such as an ethoxyethyl group or a methoxypropyl group.

Of these groups, a tert-butyloxycarbonyl group, tert-butyloxycarbonylmethyl group, tert-butyl group, tetrahydropyranyl group or ethoxyethyl group is preferred.

The acid dissociable, dissolution inhibiting group X' can also use other groups typically used in chemically amplified positive resist compositions.

In general formula (III), there are no particular restrictions on the position at which the —OX' group is bonded to the benzene ring, although bonding at the position labeled 4 in the above formula (the para position) is preferred.

The structural unit (a3) typically accounts for 10 to 50 mol %, preferably from 20 to 40 mol %, of the resin component. By ensuring a quantity of at least 10 mol %, the alkali solubility after dissociation can be improved and an improved pattern shape can also achieved. On the other hand, by ensuring a quantity of no more than 50 mol %, a better balance can be achieved with the other structural units.

Structural Unit (a4)

Structural unit (a4) is represented by general formula (IV) shown below.

[Chemical Formula 9]

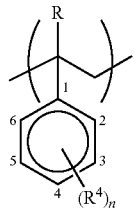

(IV)

wherein R represents —H, $R^4$ represents a lower alkyl group, and n represents either 0 or an integer of from 1 to 3.

The lower alkyl group of the group $R^4$ may be either a straight chain or a branched chain, and preferably has 1 to 5 carbon atoms.

n is either 0, or an integer from 1 to 3, but is preferably 0.

The structural unit (a4) typically accounts for 1 to 35 mol %, and preferably from 5 to 20 mol % of the resin component. By ensuring a quantity of at least 1 mol %, a significant shape improvement effect can be achieved (particularly in terms of improving the film thinning (thickness loss) described below), and by ensuring a quantity of no more than 35 mol %, a better balance can be achieved with the other structural units.

The resin component of the first example must contain the structural unit (a1) and at least one of the structural units (a2) and (a3), and may also contain a structural unit (a4). The resin component is preferably a polymer (or copolymer) containing structural units (a1), (a2) and (a4).

Furthermore, the resin component of the first example may be a copolymer containing all of the structural units, or a mixture of a plurality of different polymers each containing at least one of the structural units. Combinations of these two possibilities are also possible.

Furthermore, the resin component may also comprise other units other than the structural units (a1), (a2), (a3) and (a4) described above, although the structural units (a1), (a2), (a3) and (a4) preferably account for at least 80 mol %, and even more preferably at least 90 mol %, and most preferably 100 mol % of the component.

The polystyrene equivalent weight average molecular weight of the resin component of the first example, as determined by GPC, is typically within a range from 2,000 to 30,000, preferably from 5,000 to 20,000. The resin component of the first example can be produced by polymerization of the monomers that provide the various structural units, using known methods.

Resin Component of a Second Example

As another preferred example of the component (A-1), there can be mentioned a resin component (resin component of a second example) that contains monocyclic or polycyclic group-containing acid dissociable, dissolution inhibiting groups at ester side chain sections, contains structural units derived from an acrylate ester within the main chain, and exhibits increased alkali solubility under the action of acid.

In this resin component of a second example, the action of the acid generated from the aforementioned component (B) on exposure causes the aforementioned monocyclic or polycyclic group-containing acid dissociable, dissolution inhibiting groups, which exhibit excellent etching resistance, to dissociate, thereby converting the entire resin component from an alkali-insoluble state to an alkali-soluble state. Therefore, by conducting exposure through a mask pattern during formation of a resist pattern, the alkali solubility of the exposed portions can be increased, enabling alkali developing to be conducted.

Furthermore, this resin component may include, for example, a combination of monomer units that exhibit a plurality of different functions, although the aforementioned acrylate ester structural units may also be included within any of the monomer units used in forming the resin component.

For example, the resin component of the second example preferably includes:

a structural unit which contains a monocyclic or polycyclic group-containing acid dissociable, dissolution inhibiting group, and is derived from an acrylate ester (hereafter also referred to as the first structural unit or the structural unit (a11)), a structural unit which contains a lactone-containing monocyclic or polycyclic group, and is derived from an acrylate ester (hereafter also referred to as the second structural unit or the structural unit (a12)), and a structural unit which contains a hydroxyl group-containing polycyclic group, and is derived from an acrylate ester (hereafter also referred to as the third structural unit or the structural unit (a13)). In such cases, the first structural unit is essential, and although resins containing two types of structural units, namely the first structural unit and either the second structural unit or third structural unit are suitable, resin components containing all of the first through third structural units are preferred from the viewpoint of factors such as etching resistance, resolution, and the adhesion between the resist film and the substrate.

In addition, if the resin component also includes the following structural unit (hereafter also referred to as the fourth structural unit or the structural unit (a14)), then the composition exhibits superior resolution for isolated patterns through to semi-dense patterns (line and space patterns in which for a line width of 1, the space width is from 1.2 to 2), which is preferred.

a structural unit which contains a polycyclic group that is different from the monocyclic or polycyclic group-containing acid dissociable, dissolution inhibiting group of the first structural unit, the lactone-containing monocyclic or polycyclic group of the second structural unit, and the hydroxyl group-containing polycyclic group of the third structural unit, and is derived from an acrylate ester.

Accordingly, the combination of the first through fourth structural units can be adjusted appropriately in accordance with factors such as the desired properties.

As the monocyclic group in the first structural unit, there can be exemplified groups in which one hydrogen atom has been removed from a cycloalkane. Specific examples of such groups include a cyclopentyl group and a cyclohexyl group.

As the polycyclic group in the first structural unit, there can be exemplified groups in which one hydrogen atom has been removed from a bicycloalkane, tricycloalkane, or tetracycloalkane.

Specific examples of such groups include groups in which one hydrogen atom has been removed from a polycycloalkane such as adamantane, norbornane, isobornane, tricyclodecane or tetracyclododecane.

These types of polycyclic groups can be appropriately selected from the multitude of groups proposed for the resin components of resist compositions designed for use with ArF excimer lasers.

Of these, a adamantyl group, norbornyl group, or tetracyclododecanyl group is preferred from the viewpoint of industry.

There are no particular restrictions on the acid dissociable, dissolution inhibiting group of the first structural unit, provided it displays an alkali dissolution inhibiting effect that causes the entire resin component to be alkali insoluble prior to exposure, but dissociates under the action of acid generated from the aforementioned component (B) following exposure, causing the entire resin component to become alkali soluble.

Generally, groups which form a cyclic or chain-type tertiary alkyl ester at the carboxyl group of acrylic acid are widely known as acid dissociable, dissolution inhibiting groups.

In the first structural unit, the polycyclic group-containing acid dissociable, dissolution inhibiting group is preferably selected from general formulas (I-B), (II-B), and (III-B) shown below, as such groups yield superior levels of resolution and dry etching resistance.

[Chemical Formula 10]

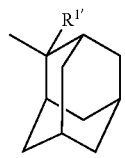

(I-B)

wherein $R^{1'}$ represents a lower alkyl group.

[Chemical Formula 11]

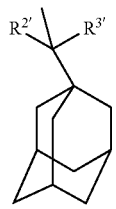

(II-B)

wherein each of $R^{2'}$ and $R^{3'}$ independently represents a lower alkyl group.

[Chemical Formula 12]

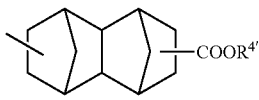

(III-B)

wherein R⁴' represents a tertiary alkyl group.

Specifically, the first structural unit is preferably at least one unit selected from general formulas (I'), (II'), and (III') shown below.

[Chemical Formula 13]

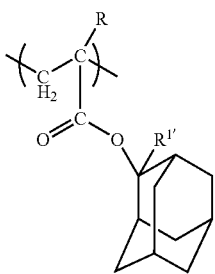

(I')

wherein R represents a hydrogen atom, and R¹'' represents a lower alkyl group.

[Chemical Formula 14]

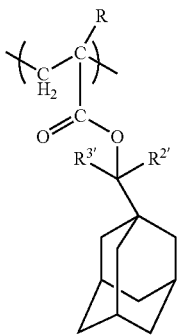

(II')

wherein R represents a hydrogen atom, and each of R²' and R³' independently represents a lower alkyl group.

[Chemical Formula 15]

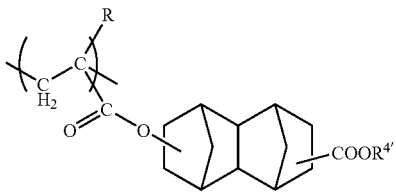

(III')

wherein R represents a hydrogen atom, and R⁴' represents a tertiary alkyl group.

The structural unit represented by general formula (I') above represents the case wherein the carbon atom that is adjacent to the oxygen atom (—O—) of the ester function of the acrylate unit is a tertiary alkyl group that exists within the ring skeleton of an adamantyl group or the like.

Furthermore, in the aforementioned general formula (I'), R is a hydrogen atom.

Furthermore, the group R¹' is preferably a straight-chain or branched lower alkyl group of 1 to 5 carbon atoms, and specific examples include a methyl group, ethyl group, propyl group, isopropyl group, n-butyl group, isobutyl group, tert-butyl group, pentyl group, isopentyl group, and neopentyl group. Of these, an alkyl group of at least 2 carbon atoms, and preferably from 2 to 5 carbon atoms is preferred. In such cases, the acid dissociability tends to increase compared with the case in which R¹' is a methyl group. From an industrial viewpoint, a methyl group or ethyl group is preferred.

The structural unit represented by general formula (II') above represents the case wherein the carbon atom that is adjacent to the oxygen atom (—O—) of the ester function of the acrylate unit is a tertiary alkyl group, and a ring skeleton such as an adamantyl group exists within this tertiary alkyl group.

In the aforementioned general formula (II'), R is as defined above for general formula (I'), namely, a hydrogen atom.

The groups R²' and R³' each preferably represents, independently, a lower alkyl group of 1 to 5 carbon atoms. These types of groups tend to exhibit a higher acid dissociability than a 2-methyl-2-adamantyl group.

Specifically, the groups R²' and R³' each represents, independently, the same types of straight chain or branched lower alkyl groups as those described above for R¹'. Of these groups, the case in which R²' and R³' are both methyl groups is preferred from an industrial viewpoint.

The structural unit represented by general formula (III') above represents the case wherein the carbon atom that is adjacent to the oxygen atom (—O—) of an ester different from the ester function of the acrylate unit is a tertiary alkyl group, and the acrylate ester and this different ester are connected via a ring skeleton such as a tetracyclododecanyl group.

In the aforementioned general formula (III'), R is as defined above for general formulas (I') and (II'), namely, a hydrogen atom.

Furthermore, the group R⁴ represents a tertiary alkyl group such as a tert-butyl group or tert-amyl group, and a tert-butyl group is preferred from an industrial viewpoint.

Of the units described above, the use of either a unit represented by one of general formulas (I') or (II'), or units represented by both general formulas (and preferably units of both formulas) is preferred, and moreover, the case in which R¹' is a methyl group or an ethyl group, and R²' and R³' are both methyl groups provides superior resolution, and is consequently preferred.

In the aforementioned second structural unit, the lactone functional group is effective in improving the adhesion between the resist film and the substrate, and increasing the hydrophilicity relative to the developing solution. There are no particular restrictions on the second structural unit, provided they include both this type of lactone functional group and a monocyclic or polycyclic group.

Examples of lactone-containing monocyclic groups include groups in which one hydrogen atom has been removed from γ-butyrolactone.

Furthermore, examples of lactone-containing polycyclic groups include groups in which one hydrogen atom has been removed from lactone-containing tricycloalkanes of the structural formulas shown below.

[Chemical Formula 16]

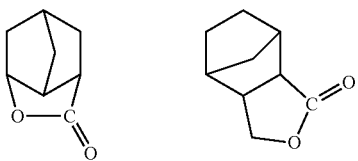

Furthermore, in the second structural unit, the aforementioned lactone-containing monocyclic or polycyclic group is preferably at least one unit group selected from general formulas (IV-B) and (V-B) shown below.

[Chemical Formula 17]

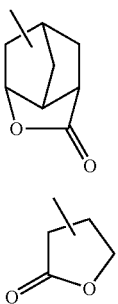

(IV-B)

(V-B)

As the second structural unit, more specific examples include structural units derived from an acrylate ester containing a lactone-containing monocycloalkyl group or tricycloalkyl group, as represented by the structural formulas shown below.

[Chemical Formula 18]

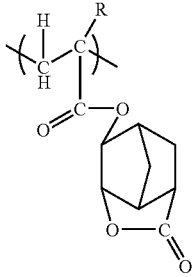

wherein R represents a hydrogen atom.

[Chemical Formula 19]

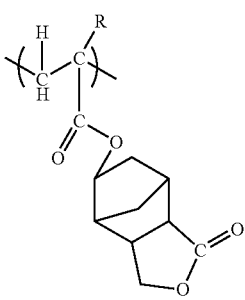

wherein R represents a hydrogen atom.

[Chemical Formula 20]

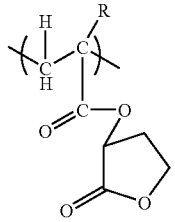

wherein R represents a hydrogen atom.

Of these units, γ-butyrolactone esters of acrylic acid with an ester linkage at the α carbon atom or norbornane lactone esters are particularly preferred from the viewpoint of industrial availability.

Because the hydroxyl group of the third structural unit is a polar group, using this structural unit results in an enhanced affinity for the entire resin component relative to the developing solution, and an improvement in the alkali solubility of the exposed sections of the resist. Accordingly, the third structural unit contributes to an improvement in the resolution.

In the third structural unit, as the polycyclic group, a group can be selected appropriately from the same plurality of polycyclic groups listed in the description of the aforementioned first structural unit.

In the third structural unit, there are no particular restrictions on the polycyclic group provided it is a hydroxyl group-containing polycyclic group, although groups such as a hydroxyl group-containing adamantyl group are particularly desirable.

In addition, using a hydroxyl group-containing adamantyl group represented by general formula (VI-B) shown below increases the dry etching resistance and improves the perpendicularity of the pattern cross-sectional shape, and is consequently preferred.

[Chemical Formula 21]

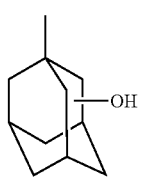

(VI-B)

Specifically, the third structural unit is preferably a structural unit represented by general formula (VI') shown below.

[Chemical Formula 22]

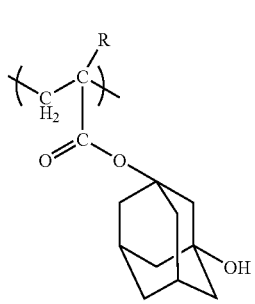

(VI')

wherein R represents a hydrogen atom.

When the first structural unit accounts for 30 to 60 mol %, preferably 30 to 50 mol % of the combined total of all the structural units that constitute the aforementioned resin component of the second example, the resolution becomes superior, which is preferred.

When the second structural unit accounts for 20 to 60 mol %, preferably 20 to 50 mol %, the resolution becomes superior, which is preferred.

When the third structural unit accounts for 1 to 50 mol %, preferably 20 to 40 mol %, the shape of the resist pattern becomes superior, which is preferred.

Furthermore, as described above, the resin component preferably also includes, as the aforementioned fourth structural unit, a structural unit (structural unit (a14)) which contains a polycyclic group that is "different from the aforementioned polycyclic group-containing acid dissociable, dissolution inhibiting group, the aforementioned lactone-containing monocyclic or polycyclic group, and the aforementioned hydroxyl group-containing polycyclic group", and is derived from an acrylate ester.

The expression "different from the aforementioned polycyclic group-containing acid dissociable, dissolution inhibiting group, the aforementioned lactone-containing monocyclic or polycyclic group, and the aforementioned hydroxyl group-containing polycyclic group" means that the polycyclic group of the structural unit (a14) does not duplicate the polycyclic group-containing acid dissociable, dissolution inhibiting group of the first structural unit, the lactone-containing monocyclic or polycyclic group of the second structural unit, or the hydroxyl group-containing polycyclic group of the third structural unit. In other words, it means that the structural unit (a14) contains no polycyclic group-containing acid dissociable, dissolution inhibiting groups of the first structural unit, no lactone-containing monocyclic or polycyclic groups of the second structural unit, and no hydroxyl group-containing polycyclic groups of the third structural unit.

There are no particular restrictions on this polycyclic group, provided it is selected so as not to duplicate any of the first through third structural units within a single resin component. For example, the same polycyclic groups as those described in relation to the aforementioned first structural unit can be used, and any of the multitude of materials conventionally used for ArF positive resist materials can be used. From the viewpoint of industrial availability, one or more groups selected from amongst a tricyclodecanyl group, adamantyl group, and tetracyclododecanyl group is preferred.

Examples of the structural unit (a14) are shown below in [Chemical Formula 23] through [Chemical Formula 25].

[Chemical Formula 23]

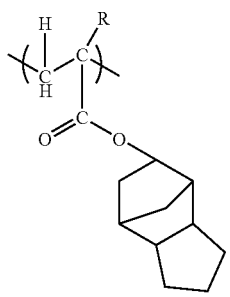

wherein R represents a hydrogen atom.

[Chemical Formula 24]

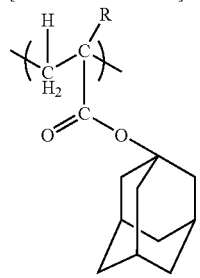

wherein R represents a hydrogen atom.

[Chemical Formula 25]

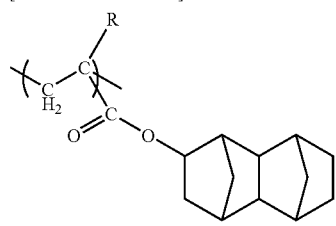

wherein R represents a hydrogen atom.

When the structural unit (a14) typically accounts for 1 to 25 mol %, preferably from 10 to 20 mol %, of the combined total of all the structural units that constitute the aforementioned resin component of the second example, then the resolution for isolated patterns through to semi-dense patterns is superior, which is preferred.

The resin component of the second example may be a copolymer or a mixed resin. Although there are no particular restrictions on the weight average molecular weight of the copolymer that constitutes the resin component, or the polymers that constitute the mixed resin, the value is preferably within a range from 2,000 to 30,000, more preferably from 5,000 to 20,000. When the weight average molecular weight is within the aforementioned range, the solubility of the component within the resist solvent becomes satisfactory.

The copolymer or the polymers that constitute the mixed resin can be produced easily by conventional radical polymerization or the like of the corresponding acrylate ester monomers and the like, using a radical polymerization initiator such as azobisisobutyronitrile (AIBN).

(A-2)

Next, the component (A-2) is described.

Second requirement: When the resin component used as component (A) is represented by a structural formula, a value N represented by a numerical formula $N=Na/(Nc-No)$ is 3 or less, wherein Na represents the total number of atoms in the structural formula, Nc represents the number of carbon atoms in the structural formula, and No represents the number of oxygen atoms in the structural formula.

For example, with respect to a hydroxystyrene unit represented by general formula (I) above wherein R is H, the number of carbon atoms (Nc) constituting one structural unit is 8, the number of oxygen atom (No) is 1, the number of hydrogen atoms is 8, and, thus, the total number of these atoms (Na) is 17. In this case, the value N is $17/(8-1)=$about 2.4.

Further, with respect to a tert-butyl acrylate unit represented by general formula (II-1) above wherein R is H and each of $R^{11}$, $R^{12}$ and $R^{13}$ is a methyl group, the number of carbon atoms (Nc) constituting one structural unit is 7, the number of oxygen atoms (No) is 2, the number of hydrogen atoms is 12, and, thus, the total number of these atoms (Na) is 21. In this case, the value N is 21/(7−2)=4.2.

Furthermore, with respect to a styrene unit represented by general formula (IV) above wherein R is H and n is 0, the number of carbon atoms (Nc) constituting one structural unit is 8, the number of oxygen atom (No) is 0, the number of hydrogen atoms is 8, and, thus, the total number of these atoms (Na) is 16. In this case, the value N is 16/(8−0)=2.0.

Therefore, with respect to a resin component represented by the above-mentioned three structural units (for example, the resin component used in Example 1 described below), when hydroxystyrene unit:tert-butyl acrylate unit:styrene unit molar ratio is 0.65:0.2:0.15, the value N of the resin component is 2.4×0.65+4.2×0.2+2.0×0.15=2.7.

The present inventors have found that, when a resist composition is applied to a substrate, prebaked, and exposed to electron beam or EUV in a vacuum, the degree of variation in the total pressure of the atmosphere inside the exposure system between the state prior to exposure and the state following exposure correlates linearly with the aforementioned value N, and that the degree of variation in the total pressure tends to becomes smaller as the value N becomes smaller.

Although exposure using electron beam or EUV is conducted in a vacuum, the pressure of the atmosphere inside the exposure system becomes higher by the generation of contaminants. That means, the smaller the amount of contaminants generated inside the exposure system, the smaller the aforementioned degree of variation in the total pressure.

Therefore, the degree of variation in the total pressure of the atmosphere inside the exposure system between the state prior to exposure and the state following exposure tends to becomes smaller as the value N of a component (A) within a resist composition becomes smaller. When the degree of variation in the total pressure becomes small, it means that substances in the resist composition become difficult to be emitted in the atmosphere of the exposure system, namely, the substances in the resist composition become difficult to be gasified. Therefore, by the aforementioned value N, the ease (or difficulty) of gasification of a resist composition during exposure using electron beam or EUV can be evaluated.

Herein, it is to be noted that an oxygen atom exhibits a large absorbance to an exposure light using electron beam or EUV, so that, when a resin component contains an oxygen atom, a decomposition reaction occurs easily. Thus, it is presumed that the degassing property of a resist composition can be evaluated by the value N which correlates with the proportion of oxygen atoms in the resin component.

In the present invention, by using a resin (A-2) having a value N of 3 or less as a component (A) of a resist composition, it becomes possible to effectively suppress gasification of the resist composition during exposure, and to reduce the contamination of the inside of the exposure apparatus. That is, it becomes possible to prevent contamination of mirrors and mask caused by emittance of substances in the atmosphere of the exposure system during exposure. The value N of the aforementioned second requirement is preferably 2.7 or less.

It is preferred that gasification of the resist composition during exposure is as small as possible, and that the degree of variation of total pressure in the atmosphere inside the exposure system between the state prior to exposure and the state following exposure is as small as possible. Therefore, it is preferred that the value N of the second requirement is as small as possible, which means that there is no technical significance of defining a lower limit of the value N.

As a component (A-2), any of the compounds which are typically used for a chemically amplified resist, and which satisfy the aforementioned second requirement can be used. These compounds may be used individually or in combination.

As an example of a component (A-2), the resin component of the first example exemplified above as a preferred example of the component (A-1) can be mentioned. Further, a resin component of the first example in which R in the general formulas of at least one of the structural units (a1) to (a4) is replaced by a methyl group (—$CH_3$) can be used.

The component (A-2) can be produced by conventional polymerization of the constituent monomers of the structural units. However, it is necessary that the types and proportions of the structural units be appropriately selected, so as to satisfy the aforementioned second requirement.

In order to make the value N smaller, it is preferred to use a component (A-2) in which the structural units have a smaller number of oxygen atoms. When a structural unit containing oxygen atoms is used, it is preferred that the proportion of such structural unit is as small as possible.

For example, the copolymer containing structural units (a1), (a2) and (a4) (wherein, in the general formulas, each R represents —H or —$CH_3$) described above in connection with the resin component of the first example can be preferably used.

Further, as a component (A-2), the resin component of the second example exemplified above as a preferred example of the component (A-1) can be used, provided that it satisfies the aforementioned second requirement. Further, a resin component of the second example in which the main chain of at least one of the structural units (a11) to (a14) is replaced by a main chain derived from methacrylic acid (such structural units are referred to as structural units (a11'), (a12'), (a13') and (a14'), respectively) can be used.

The component (A-2) preferably includes either one, or both of a structural unit (a11) which contains a polycyclic group-containing acid dissociable, dissolution inhibiting group, and is derived from an acrylate ester, and a structural unit (a11') which contains a polycyclic group-containing acid dissociable, dissolution inhibiting group, and is derived from a methacrylate ester.

In a preferred component (A-2), by including both of the structural unit (a11) and the structural unit (a11') as structural units which contain a polycyclic group-containing acid dissociable, dissolution inhibiting group, and are derived from a (meth)acrylate ester, a resolution improvement effect can be obtained.

Furthermore, the component (A-2) preferably includes either one, or both of a structural unit (a12) which contains a lactone-containing monocyclic or polycyclic group, and is derived from an acrylate ester, and a structural unit (a12') which contains a lactone-containing monocyclic or polycyclic group, and is derived from a methacrylate ester.

In a preferred component (A-2), the structural unit which contains a lactone-containing monocyclic or polycyclic group, and is derived from a (meth)acrylate ester preferably includes both of the structural unit (a12) and the structural unit (a12').

In addition, the component (A-2) preferably includes either one, or both of a structural unit (a13) which contains a hydroxyl group-containing polycyclic group, and is derived from an acrylate ester, and a structural unit (a13') which contains a hydroxyl group-containing polycyclic group, and is derived from a methacrylate ester.

In a preferred component (A-2), the structural unit which contains a hydroxyl group-containing polycyclic group, and is derived from a (meth)acrylate ester preferably includes both of the structural unit (a13) and the structural unit (a13').

Furthermore, amongst the three sets of structural units, namely the set of the structural units (a11) and (a11'), the set of the structural units (a12) and (a12'), and the set of the structural units (a13) and (a13'), the component (A-2) preferably includes at least two of these sets, and most preferably includes all three sets.

(A-3)

Next, the component (A-3) is described.

As the component (A-3), among the resins typically used for a chemically amplified resist, one or more resins can be used, such that the component (A-3) contains a resin satisfying the aforementioned first requirement as a main component, and that the component (A-3) as a whole satisfies the aforementioned second requirement.

The component (A-3) may contain a resin which is other than resins satisfying the aforementioned first requirement and which exhibits changed alkali solubility under action of acid. However, it is necessary that component (A-3) as a whole satisfies the aforementioned second requirement.

As the component (A-3), for example, a resin can be used which contains, as a main component, a resin component of the first example exemplified above as a preferred example of the component (A-1), and which satisfies the aforementioned second requirement.

Further, a resin can also be used which contains, as a main component, a resin component of the second example exemplified above as a preferred example of the component (A-1), and which satisfies the aforementioned second requirement.

Among these, it is preferred to use, as the component (A-3), a resin component of the first example exemplified above as a preferred example of the component (A-1), which satisfies the aforementioned second requirement.

The resist composition of the present invention may contain a low-molecular-weight compound exhibiting changed alkali solubility under action of acid, which is other than the component (A).

There are no particular restrictions on the low molecular-weight-compound, provided it is of low molecular weight, and contains the type of acid dissociable, dissolution inhibiting group described above in connection with the component (A-1).

Examples of the low-molecular-weight compound typically include compounds with a molecular weight of not more than 2,000, wherein some of the hydrogen atoms of hydroxyl groups within a compound containing a plurality of phenol structures have been substituted with an aforementioned acid dissociable, dissolution inhibiting group.

Examples of such compounds include low-molecular-weight phenol compounds known as sensitizers or heat resistance improvement agents used for non-chemically amplified g-line and i-line resists, wherein some of the hydrogen atoms of the hydroxyl groups within the low-molecular-weight phenol compounds have been substituted with an acid dissociable, dissolution inhibiting group, and any of these compounds can be used.

Examples of these low-molecular-weight phenol compounds include the compounds listed below.

Namely, examples include bis(4-hydroxyphenyl)methane, bis(2,3,4-trihydroxyphenyl)methane, 2-(4-hydroxyphenyl)-2-(4'-hydroxyphenyl)propane, 2-(2,3,4-trihydroxyphenyl)-2-(2',3',4'-trihydroxyphenyl)propane, tris(4-hydroxyphenyl)methane, bis(4-hydroxy-3,5-dimethylphenyl)-2-hydroxyphenylmethane, bis(4-hydroxy-2,5-dimethylphenyl)-2-hydroxyphenylmethane, bis(4-hydroxy-3,5-dimethylphenyl)-3,4-dihydroxyphenylmethane, bis(4-hydroxy-2,5-dimethylphenyl)-3,4-dihydroxyphenylmethane, bis(4-hydroxy-3-methylphenyl)-3,4-dihydroxyphenylmethane, bis(3-cyclohexyl-4-hydroxy-6-methylphenyl)-4-hydroxyphenylmethane, bis(3-cyclohexyl-4-hydroxy-6-methylphenyl)-3,4-dihydroxyphenylmethane, 1-[1-(4-hydroxyphenyl)isopropyl]-4-[1,1-bis(4-hydroxyphenyl)ethyl]benzene, and dimers, trimers and tetramers of formalin condensation products of phenols such as phenol, m-cresol, p-cresol and xylenol. Needless to say, low-molecular-weight compounds usable in the present invention are not limited to these compounds.

There are no particular restrictions on the acid dissociable, dissolution inhibiting group, and suitable examples include the groups described above.

In the resist composition of the present invention, the content of component (A) can be appropriately adjusted depending on the thickness of the resist film to be formed. Further, when component (A) is used in combination with a low-molecular-weight compound exhibiting changed alkali solubility under action of acid, it is preferred that the total content of component (A) and the low molecular weight compound is appropriately adjusted so as to obtain a desired solid fraction content.

<Component (B)>

The present invention is characterized in that the component (B) includes at least one onium salt selected from the group consisting of onium salts having an anion represented by the aforementioned general formula (b-0-1) or (b-0-2).

In the aforementioned general formulas (b-0-1) and (b-0-2), each of Y and Z independently represents a straight-chain or branched alkyl group in which at least one hydrogen atom has been substituted with a fluorine atom, and the number of carbon atoms within the alkyl group is typically within a range from 1 to 10, preferably from 1 to 7, more preferably from 1 to 3.

Lower numbers of carbon atoms within the alkylene group X or the alkyl groups Y and Z result in better solubility within the resist solvent, and are consequently preferred.

Furthermore, in the alkylene group X or the alkyl groups Y and Z, the larger the number of hydrogen atoms that have been substituted with fluorine atoms, the stronger the acidity becomes, and the transparency relative to high energy light beams of 200 nm or less or electron beams also improves favorably. The fluorine atom proportion within the alkylene group or alkyl groups, namely the fluorination ratio, is preferably within a range from 70 to 100%, and even more preferably from 90 to 100%, and perfluoroalkylene or perfluoroalkyl groups in which all of the hydrogen atoms have been substituted with fluorine atoms are the most desirable.

The cation of the component (B) is an iodonium salt or a sulfonium salt, and a sulfonium salt is preferred.

The component (B) preferably includes a sulfonium compound represented by the aforementioned general formula (b-1) or (b-2) (hereafter, these sulfonium compounds are frequently referred to as sulfonium compound 1 and sulfonium compound 2, respectively).

In formulas (b-1) and (b-2) above, X, Y and Z are as described above.

Each of $R^1$ to $R^3$ independently represents an aryl group or an alkyl group which may have a substituent.

Of the groups $R^1$ to $R^3$, at least one group represent an aryl group. Compounds in which at least two of $R^1$ to $R^3$ represent aryl groups are preferred, and compounds in which all of $R^1$ to $R^3$ are aryl groups are the most preferred.

There are no particular restrictions on the aryl groups of $R^1$ to $R^3$, and suitable examples include aryl groups of 6 to 20 carbon atoms (carbon atoms excluding substituents), such as phenyl groups and naphthyl groups, which may or may not be substituted. From the viewpoint of enabling low cost synthesis, aryl groups of 6 to 10 carbon atoms are preferred. The substituent which the aryl groups may have include an alkyl group, an alkoxy group, a halogen atom or the like, preferably an alkyl group or an alkoxy group, and most preferably an alkoxy group. As an alkyl group, a lower alkyl group of not more than 5 carbon atoms is preferred. As an alkoxy group, an alkoxy group having a lower alkyl group of not more than 5 carbon atoms is preferred, and a methoxy group is most desirable.

There are no particular restrictions on the alkyl groups of $R^1$ to $R^3$, and suitable examples include straight-chain, branched, or cyclic alkyl groups of 1 to 10 carbon atoms. From the viewpoint of achieving excellent resolution, alkyl groups of 1 to 5 carbon atoms are preferred. Specific examples include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group. From the viewpoint of achieving superior resolution and enabling low cost synthesis, a methyl group is the most desirable.

Among these compounds, it is most preferred that the cation has any one of the following structures.

[Chemical Formula 26]

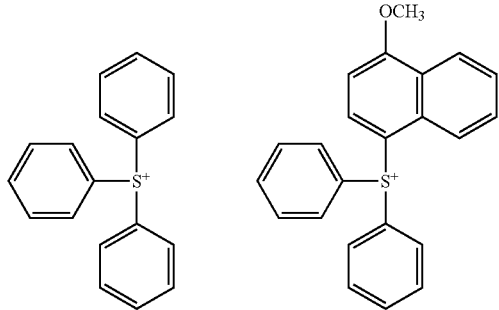

These sulfonium compounds 1 and 2 may be used either alone, or in combinations of two or more different compounds.

Further, of sulfonium compounds 1 and 2, sulfonium compound 1 is most desirable.

In the component (B), the combined quantity of the one or more compounds selected from the sulfonium compounds 1 and 2 is preferably within a range from 25 to 100% by weight of the entire component (B), more preferably from 30 to 100% by weight. Ensuring that this proportion is at least 25% by weight enables the effects of the present invention to manifest adequately.

In the present invention, the component (B) may also include conventional acid generators typically used in chemically amplified resists.

A large variety of acid generators are already known, including onium salts such as iodonium salts and sulfonium salts, oxime sulfonates, diazomethanes such as bisalkyl or bisaryl sulfonyl diazomethanes and poly(bis-sulfonyl)diazomethanes, nitrobenzyl sulfonates, iminosulfonates, and disulfones.

Specific examples of oxime sulfonate-based acid generators include α-(p-toluenesulfonyloxyimino)-benzylcyamide, α-(p-chlorobenzenesulfonyloxyimino)-benzylcyamide, α-(4-nitrobenzenesulfonyloxyimino)-benzylcyamide, α-(4-nitro-2-trifluoromethylbenzenesulfonyloxyimino)-benzylcyamide, α-(benzenesulfonyloxyimino)-4-chlorobenzylcyamide, α-(benzenesulfonyloxyimino)-2,4-dichlorobenzylcyamide, α-(benzenesulfonyloxyimino)-2,6-dichlorobenzylcyamide, α-(benzenesulfonyloxyimino)-4-methoxybenzylcyamide, α-(2-chlorobenzenesulfonyloxyimino)-4-methoxybenzylcyamide, α-(benzenesulfonyloxyimino)-thiene-2-ylacetonitrile, α-(4-dodecylbenzenesulfonyloxyimino)-benzylcyamide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thenylcyamide, α-(methylsulfonyloxyimino)-1-cyclopentenylacetonitrile, α-(methylsulfonyloxyimino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-1-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cylopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethyl sulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile. Of these, α-(methylsulfonyloxyimino)-p-methoxyphenylacetonitrile is preferred.

Of the various diazomethane-based acid generators, specific examples of suitable bisalkyl or bisaryl sulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Furthermore, specific examples of poly(bis-sulfonyl)diazomethanes include the structures shown below, such as 1,3-bis(phenylsulfonyldiazomethylsulfonyl)propane (compound A, decomposition point 135° C.), 1,4-bis(phenylsulfonyldiazomethylsulfonyl)butane (compound B, decomposition point 147° C.), 1,6-bis(phenylsulfonyldiazomethylsulfonyl)hexane (compound C, melting point 132° C., decomposition point 145° C.), 1,10-bis(phenylsulfonyldiazomethylsulfonyl) decane (compound D, decomposition point 147° C.), 1,2-bis (cyclohexylsulfonyldiazomethylsulfonyl)ethane (compound E, decomposition point 149° C.), 1,3-bis(cyclohexylsulfonyldiazomethylsulfonyl)propane (compound F, decomposition point 153° C.), 1,6-bis(cyclohexylsulfonyldiazomethylsulfonyl)hexane (compound G, melting point 109° C., decomposition point 122° C.), and 1,10-bis(cyclohexylsulfonyldiazomethylsulfonyl)decane (compound H, decomposition point 116° C.).

[Chemical Formula 27]

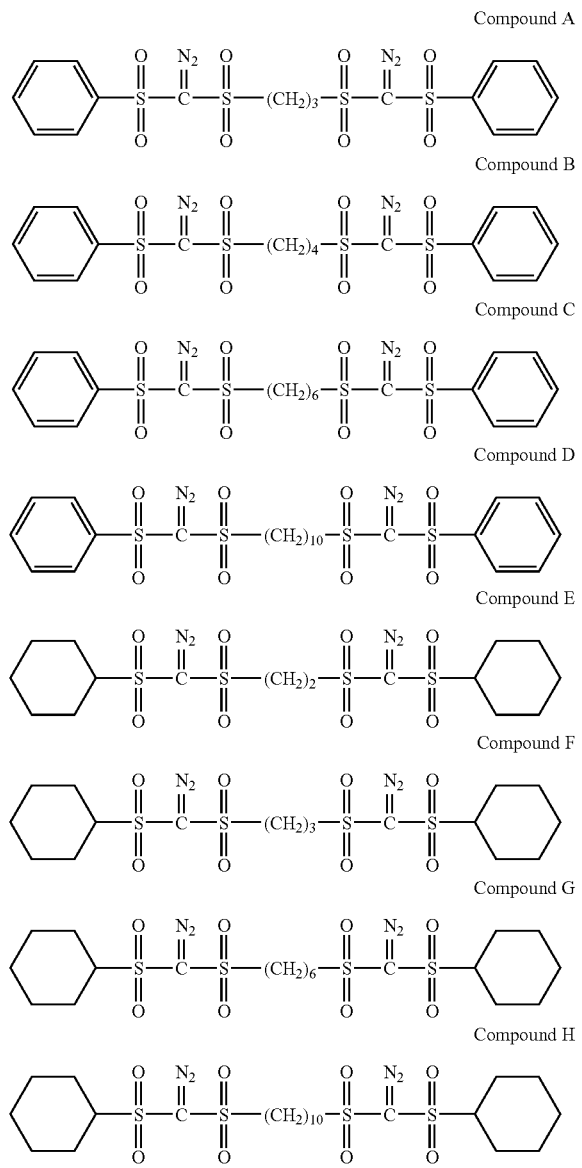

In the present invention, among the above-exemplified examples of the component (B), it is preferred to use an onium salt in which a fluorinated alkylsulfonic acid ion serves as the anion because they yield stronger acids.

Examples of suitable cations for these onium salt-based acid generators include mono- or diphenyliodonium cations, and mono-, di-, or triphenylsulfonium cations, all of which may be substituted with lower alkyl groups such as methyl groups, ethyl groups, propyl groups, n-butyl groups, and tert-butyl groups, or lower alkoxy groups such as methoxy groups and ethoxy groups; as well as a dimethyl(4-hydroxynaphthyl) sulfonium cation or the like.

Furthermore, the anion of these types of onium salt-based acid generators is preferably a fluorinated alkylsulfonate ion in which either some of, or all of, the hydrogen atoms of a straight-chain alkyl group of 1 to 10 carbon atoms, preferably 1 to 7 carbon atoms, more preferably 1 to 3 carbon atoms, have been fluorinated, as such anions offer the highest levels of safety. Ensuring the number of carbon atoms is not more than 7 increases the strength of the resulting sulfonic acid. Furthermore, the fluorination ratio (the proportion of fluorine atoms within the alkyl group) of the fluorinated alkylsulfonate ion is preferably within a range from 10 to 100%, and even more preferably from 50 to 100%, and anions in which all of the hydrogen atoms have been substituted with fluorine atoms are particularly desirable as they yield stronger acids Specific examples of suitable onium salt-based acid generators include diphenyliodonium trifluoromethanesulfonate or nonafluorobutanesulfonate, bis(4-tert-butylphenyl)iodonium trifluoromethanesulfonate or nonafluorobutanesulfonate, triphenylsulfonium trifluoromethanesulfonate, heptafluoropropanesulfonate or nonafluorobutanesulfonate, tri(4-methylphenyl)sulfonium trifluoromethanesulfonate, heptafluoropropanesulfonate or nonafluorobutanesulfonate, dimethyl(4-hydroxynaphthyl)sulfonium trifluoromethanesulfonate, heptafluoropropanesulfonate or nonafluorobutanesulfonate, monophenyldimethylsulfonium trifluoromethanesulfonate, heptafluoropropanesulfonate or nonafluorobutanesulfonate, diphenylmonomethylsulfonium trifluoromethanesulfonate, heptafluoropropanesulfonate or nonafluorobutanesulfonate, (4-methylphenyl)diphenylsulfonium trifluoromethanesulfonate, heptafluoropropanesulfonate or nonafluorobutanesulfonate, (4-methoxyphenyl)diphenylsulfonium trifluoromethanesulfonate, heptafluoropropanesulfonate or nonafluorobutanesulfonate, and tri(4-tert-butyl)phenylsulfonium trifluoromethanesulfonate, heptafluoropropanesulfonate or nonafluorobutanesulfonate.

These onium salt-based acid generators can be used either alone, or in mixtures of two or more different compounds.

In those cases where a mixture of an onium salt-based acid generator and at least one compound selected from amongst the sulfonium compounds 1 and 2 is used as the component (B), the proportion of the onium salt-based acid generator is preferably within a range from 10 to 75% by weight, more preferably from 30 to 70% by weight. By using a blend proportion of the onium salt-based acid generator that falls within this range, a resin with particularly superior levels of LER (line edge roughness: non-uniform irregularities in the line side walls) and developing defects can be obtained. Furthermore, the blend ratio (weight ratio) between the onium salt-based acid generator and the one or more compounds selected from the sulfonium compounds 1 and 2 is preferably within a range from 1:9 to 9:1, more preferably from 1:5 to 5:1, most preferably from 1:2 to 2:1. By mixing the acid generators together in this type of ratio, a resin with particularly superior levels of LER and developing defects can be obtained.

The component (B) is typically used in a quantity within a range from 0.1 to 30 parts by weight, preferably from 0.5 to 20 parts by weight, more preferably from 1 to 10 parts by weight, per 100 parts by weight of the component (A). By using the component (B) in a quantity within the above-mentioned range, pattern formation proceeds satisfactorily, and the storage stability becomes satisfactory.

<Organic Solvent>

A resist composition of the present invention can be produced by dissolving the materials in an organic solvent.

As the organic solvent, any solvent capable of dissolving each of the components used to generate a homogeneous solution is suitable, and the solvent used can be one, or two or more solvents selected from amongst known solvents used for conventional chemically amplified resists.

Examples of suitable solvents include lactones such as γ-butyrolactone; ketones such as acetone, methyl ethyl ketone, cyclohexanone, methyl isoamyl ketone and 2-heptanone; polyhydric alcohols and derivatives thereof such as ethylene glycol, ethylene glycol monoacetate, diethylene glycol, diethylene glycol monoacetate, propylene glycol, propylene glycol monoacetate, dipropylene glycol, or the monomethyl ether, monoethyl ether, monopropyl ether, monobutyl ether or monophenyl ether of dipropylene glycol monoacetate; cyclic ethers such as dioxane; and esters such as methyl lactate, ethyl lactate (EL), methyl acetate, ethyl acetate, butyl acetate, methyl pyruvate, ethyl pyruvate, methyl methoxypropionate, and ethyl ethoxypropionate.

These organic solvents can be used either alone, or as mixed solvents containing two or more different solvents.

Further, a mixed solvent of propylene glycol monomethyl ether acetate (PGMEA) and a polar solvent is preferred. The mixing ratio within this type of mixed solvent can be determined on the basis of the compatibility of the PGMEA and the polar solvent, but is preferably within a range from 1:9 to 9:1, more preferably from 2:8 to 8:2.

More specifically, in those cases where EL is added as the polar solvent, the weight ratio of PGMEA:EL is preferably within a range from 1:9 to 9:1, more preferably from 2:8 to 8:2.

Furthermore, as the organic solvent, a mixed solvent of at least one of PGMEA and EL, together with γ-butyrolactone is also preferred. In such cases, the weight ratio between the former and latter components is preferably within a range from 70:30 to 95:5.

There are no particular restrictions on the quantity used of the organic solvent, which is set in accordance with the film thickness so as to produce a concentration that enables favorable application of the composition to a substrate, and is typically sufficient to produce a solid fraction concentration within the resist composition of 2 to 20% by weight, and preferably from 5 to 15% by weight.

In the present invention, it is especially preferred to use an organic solvent which contains, as a main component, at least one member selected from the group consisting of propylene glycol monomethyl ether (PGME), methyl amyl ketone (MAK), butyl acetate (BuOAc) and 3-methylmethoxypropionate (MMP) (hereafter, these compounds are frequently referred to as "PGME and the like").

The use of a resist solvent containing the above-mentioned specific organic solvent as a main component is advantageous in that contaminants are hardly generated under conditions wherein exposure must be conducted in a vacuum, such as in the case of exposure with electron beam or EUV. The reason for this is presumed to be because these organic solvents tend to volatilize under the heating conditions required in the exposure process of electron beam or EUV. Further, these organic solvents are industrially preferred from the viewpoint of safety.

By using such organic solvent containing PGME and the like as the main component, it becomes possible to reduce contaminants, regardless of composition of other components such as component (A) and component (B).

The expression "an organic solvent containing, as the main component" means that the one or more compounds selected from the group consisting of propylene glycol monomethyl ether (PGME), methyl amyl ketone (MAK), butyl acetate (BuOAc), and 3-methyl methoxy propionate (MMP) represent the main component of the solvent, and other optional solvents may also be added provided the effects of the present invention are retained.

Specifically, the proportion within the organic solvent of the one or more compounds selected from the group consisting of propylene glycol monomethyl ether (PGME), methyl amyl ketone (MAK), butyl acetate (BuOAc), and 3-methyl methoxy propionate (MMP) is typically 70% by weight or more, preferably 80% by weight or more, more preferably 90% by weight or more.

Furthermore, in such a case where an organic solvent containing PGME and the like as the main component is used, a resist composition that satisfies a first condition shown by formula (I) below is particularly desirable.

First Condition:

$$[\text{Film thickness}(1)-\text{Film thickness}(2)]/(150-130)(Å/°C.) \leq 0.2 (Å/°C.) \quad (I)$$

[In this formula, the film thickness (1) is the film thickness following application of the resist composition to a substrate in sufficient quantity to generate a film thickness of 2,300 Å±10% and subsequent heating at 13° C. for 90 seconds; and the film thickness (2) is the film thickness following application of the resist composition to a substrate in sufficient quantity to generate a film thickness of 2,300 Å±10% and subsequent heating at 150° C. for 90 seconds.]

In the case where the above formula (I) is satisfied, contamination within the exposure apparatus such as contamination of the mask or mirror can be prevented even when an electron beam or EUV is used, and as a result, stable exposure can be conducted. In other words, the problem that arises as exposure is continued, wherein a phenomenon occurs in which the exposure radiation reaching the substrate weakens, or stable exposure becomes impossible, or exposure itself becomes impossible, can be resolved.

The value represented by formula (I) above is the gradient of the variation in film thickness relative to the temperature, and smaller values for this gradient indicate a smaller degree of variation in the film thickness when heated within a range from 130 to 150° C. The value of the left-hand member of formula (I) is typically not more than 0.2 (Å/° C.), preferably not more than 0.15 (Å/° C.), more preferably not more than 0.1 (Å/° C.). The smaller this value is the better, so there is no technical meaning in prescribing a lower limit value.

The reason for specifying heating at temperature conditions of 130° C. and 150° C. is due to consideration of the prebake temperature conditions used in electron beam or EUV lithography.

Setting the heating conditions to at least 130° C. facilitates the adjustments required to obtain favorable resist pattern characteristics such as contrast. Setting the temperature conditions to not higher than 150° C. simply reflects the upper limit temperature in view of the prebake operation and the heating apparatus used in the prebake.

The heating conditions in the method of forming a resist pattern described below are not restricted to the temperature range from 130 to 150° C., but setting the temperature within this range is preferred from the viewpoints of conducting stable exposure and obtaining a favorable resist pattern, and in terms of the apparatus and operation conditions.

It is surmised that by using a resist composition that satisfies formula (I) above, the resist film adopts a stable state during prebake with respect to variations in environmental conditions such as the temperature or pressure or the like, and even when exposure (including selective exposure or direct patterning) is subsequently conducted using an electron beam or EUV, contaminants are not generated from the resist film, thus enabling contamination within the exposure apparatus to be prevented. As a result, stable exposure becomes possible.

The film thickness is set to a value of 2,300 Å±10% based on the types of film thickness values used in processes that use an electron beam or EUV. The ±10% enables measurement error to be taken into consideration, and provided the value falls within this range, the value can be applied to the criterion determined by formula (I).

Setting the heating time to 90 seconds is based on the prebake conditions used in typical lithography processes.

Furthermore, in such a case where an organic solvent containing PGME and the like as the main component is used, a composition with characteristics that satisfy a second condition described below is even more desirable.

Second Condition:

The second condition requires that the degree of variation in the total pressure of the atmosphere inside the exposure system between the state prior to exposure and the state following exposure be less than $4.0 \times 10^{-5}$ Pa. As mentioned above, exposure using an electron beam or EUV is conducted within a vacuum, but on exposure, the generation of contaminants causes an increase in the pressure inside the exposure system. The degree of variation in the aforementioned total pressure is preferably not more than $3.5 \times 10^{-5}$ Pa, more preferably not more than $3.3 \times 10^{-5}$ Pa. The smaller this value is the better, so there is no technical meaning in prescribing a lower limit value. In the future, reducing this pressure variation to the $10^{-7}$ Pa or $10^{-8}$ Pa level is feasible, and this invention includes these types of ultra low pressure levels.

The total pressure refers to the pressure inside the chamber of the exposure apparatus system in which the substrate on which the resist film of the resist composition has been formed is placed, and in which the pressure is adjusted to vacuum conditions during exposure.

A small degree of variation in the total pressure over the period of exposure, as required by the second condition, means that materials within the resist composition are unlikely to be released into the atmosphere during exposure, that is, are resistant to gasification. Therefore, by satisfying the second condition, contamination of the mirror or mask or the like by materials released into the atmosphere during exposure can be prevented.

The conditions for measuring the degree of variation in the total pressure are described below. These conditions represent the standard conditions for exposure in an apparatus that emits EUV or the like using current technology. In the future, there is a possibility of further improvements in the degree of vacuum. Currently, if the degree of variation satisfies the aforementioned numerical range under these conditions, then the object of the present invention can be satisfactorily achieved.

Exposure Conditions:

temperature: room temperature (25° C.), NewSubaru radiation optical facility at Hyogo Prefectural University, pressure: $1 \times 10^{-7}$ to $1 \times 10^{-5}$ Pa, exposure time: 30 to 120 seconds, resist film thickness: 100 to 150 nm.

The inside of the exposure system is designed so as to maintain the pressure at the above value, but as described above, when exposure is conducted, the pressure inside the exposure system increases as a result of contaminant generation. The "degree of variation in the total pressure of the atmosphere inside the exposure system between the state prior to exposure and the state following exposure" defined in the second condition can be determined by calculating the difference between the two values. In other words, the degree of variation can be determined by subtracting the pressure within the system immediately prior to exposure ($1 \times 10^{-7}$ to $1 \times 10^{-5}$ Pa) from the pressure in the system following exposure.

In such a case where an organic solvent containing PGME and the like as the main component is used, a composition that satisfies both the first condition and the second condition is particularly preferred.

For satisfying both the first condition and the second condition, it is preferred to increase the proportion of the main component (i.e., PGME and the like) in the organic solvent.

<Nitrogen-Containing Organic Compound (D)>

In a positive resist composition of the present invention, in order to improve the resist pattern shape and the post exposure stability of the latent image formed by the pattern-wise exposure of the resist layer, a nitrogen-containing organic compound (D) (hereafter referred to as the component (D)) may be added as an optional component.

A multitude of these components (D) have already been proposed, and any of these known compounds may be used, although an aliphatic amine, and particularly a secondary aliphatic amine or tertiary aliphatic amine is preferred.

Examples of these aliphatic amines include amines in which at least one hydrogen atom of ammonia $NH_3$ has been substituted with an alkyl group or hydroxyalkyl group of not more than 12 carbon atoms (i.e., alkylamines or alkyl alcohol amines). Specific examples of these aliphatic amines include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, and tri-n-dodecylamine; and alkyl alcohol amines such as diethanolamine, triethanolamine, diisopropanolamine, triisopropanolamine, di-n-octanolamine, and tri-n-octanolamine. Among these, alkyl alcohol amines and trialkyl amines are preferred, and trialkyl amines are most preferred. Among trialkylkl amines, those which have an alkyl group of 5 to 10 carbon atoms such as tri-n-octyl amine, are particularly preferred.

These compounds can be used either alone, or in combinations of two or more different compounds.

The component (D) is typically used in a quantity within a range from 0.01 to 5.0 parts by weight per 100 parts by weight of the component (A).

<Component (E)>

Furthermore, in a positive resist composition of the present invention, in order to prevent any deterioration in sensitivity caused by the addition of the above component (D), and improve the resist pattern shape and the post exposure stability of the latent image formed by the pattern-wise exposure of the resist layer, an organic carboxylic acid, or a phosphorus oxo acid or derivative thereof (E) (hereafter referred to as the component (E)) can also be added as another optional component. The component (D) and the component (E) can be used in combination, or either one can also be used alone.

Examples of suitable organic carboxylic acids include malonic acid, citric acid, malic acid, succinic acid, benzoic acid, and salicylic acid.

Examples of suitable phosphorus oxo acids or derivatives thereof include phosphoric acid or derivatives thereof such as esters, including phosphoric acid, di-n-butyl phosphate and diphenyl phosphate; phosphonic acid or derivatives thereof such as esters, including phosphonic acid, dimethyl phosphonate, di-n-butyl phosphonate, phenylphosphonic acid, diphenyl phosphonate, and dibenzyl phosphonate; and phosphinic acid or derivatives thereof such as esters, including phosphinic acid and phenylphosphinic acid, and of these, phosphonic acid is particularly preferred.

The component (E) is typically used in a quantity within a range from 0.01 to 5.0 parts by weight per 100 parts by weight of the component (A).

<Other Components>

If desired, other miscible additives can also be added to a positive resist composition of the present invention. Examples of such miscible additives include additive resins for improving the performance of the resist film, surfactants for improving the ease of application, dissolution inhibitors, plasticizers, stabilizers, colorants, halation prevention agents, and dyes.

<Method of Forming Resist Pattern>

The method for forming a resist pattern according to the present invention can be performed, for example, as follows.

Firstly, a positive resist composition according to the present invention is applied to a substrate such as a silicon wafer using a spinner or the like, and a prebake is conducted under temperature conditions of 80 to 150° C., preferably 130 to 150° C., for 40 to 120 seconds, preferably 60 to 90 seconds. Then, using an EUV exposure apparatus or an electron beam apparatus, the resulting film is subjected to selective exposure directly or through a desired mask pattern in a vacuum (for example, $1 \times 10^{-7}$ to $1 \times 10^{-5}$ Pa), followed by PEB (post-exposure baking) under temperature conditions of 80 to 150° C. for 40 to 120 seconds, preferably 60 to 90 seconds.

Subsequently, developing is conducted using an alkali developing solution such as a 0.1 to 10% by weight aqueous solution of tetramethylammonium hydroxide. In this manner, a resist pattern that is faithful to the mask pattern can be obtained.

An organic or inorganic anti-reflective film may also be provided between the substrate and the applied layer of the resist composition.

Thus, as described above, by the present invention, there is provided a resist composition for use in a lithography process using electron beam or EUV and a method for forming a resist pattern, in which good sensitivity can be achieved.

When an onium salt having an anion represented by general formula (b-0-1) or (b-0-2) is applied to a lithography process using excimer laser such as ArF and KrF, there is a tendency that the sensitivity becomes low, as compared to a conventional onium salt-based acid generator which uses a fluoroalkyl sulfonate as an anion, such as triphenylsulfonium nonafluorobutanesulfonate and triphenylsulfonium trifluoromethanesulfonate.

On the other hand, when such an onium salt having an anion represented by general formula (b-0-1) or (b-0-2) is applied to a lithography process using electron beam or EUV, good sensitivity can be achieved, as compared to a conventional onium salt-based acid generator.

The reason for this is not clear, but it is presumed that the scheme of energy generation by exposure in the case of electron beam or EUV is different from the case of an excimer laser. In a lithography process using electron beam and a lithography process using EUV, there is a correlation between the sensitivity of the acid generator. Specifically, for example, when a good result is obtained in a lithography process using electron beam, there is a tendency that a good result can also be obtained in a lithography process using EUV.

As described above, in the present invention, a specifically high sensitivity can be achieved in a lithography process using electron beam or EUV. Therefore, the present invention is especially suitable in these processes where high sensitivity is required. Particularly, the present invention is suitable for a lithography process using EUV.

Furthermore in an onium salt having an anion represented by general formula (b-0-1) or (b-0-2), the anion portion has a relatively bulky structure, so that diffusion of generated acid is appropriately controlled, and, hence, improvement of resolution can be expected.

EXAMPLES

Hereinbelow, the effects of the present invention will be elucidated more specifically with reference to the following examples.

Example 1

The component (A) and the component (B) shown below were dissolved in an organic solvent, to thereby produce a positive resist composition. The N value of the component (A) is 2.70.

Component (A): 100 parts by weight of a copolymer (weight average molecular weight 10,000) obtained by polymerizing p-hydroxystyrene, styrene and t-butyl acrylate which were charged at a molar ratio of 65/15/20 (%)

Component (B): 9.9 parts by weight of a compound represented by the following chemical formula (molecular weight 555)

[Chemical Formula 28]

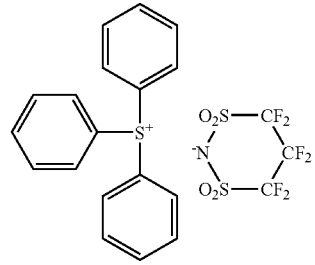

Organic solvent: 2,000 parts by weight of PGMEA

Component (D): 1.0 part by weight of tri-n-octylamine

Example 2

A resist composition was produced in substantially the same manner as in Example 1, except that component (B) was changed as follows.

Component (B): 11.3 parts by weight of a compound represented by the following chemical formula (molecular weight 636)

[Chemical Formula 29]

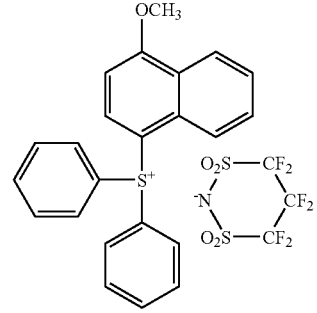

Comparative Example 1

A resist composition was produced in substantially the same manner as in Example 1, except that component (B) was changed as follows.

Component (B): 10 parts by weight of a compound represented by the following chemical formula (molecular weight 562)

[Chemical Formula 30]

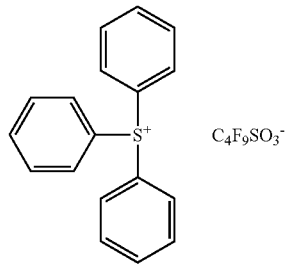

The resist compositions obtained in Examples 1 and 2 and Comparative Example 1 were applied to an EUV lithography process, and the sensitivity was evaluated as described below. The results are shown in Table 1.

(Measurement of Sensitivity in EUV Process)

The above resist composition was applied to a silicon substrate in sufficient quantity to generate a film thickness of 100 nm±10%, and the film was then heated for 90 seconds under temperature conditions of 130° C.

Subsequently, under conditions including a pressure of $1\times10^{-7}$ to $1\times10^{-5}$ Pa, and a temperature of room temperature (25° C.), the NewSubaru radiation optical facility at Hyogo Prefectural University was used to conduct an exposure of the resist film, using light of 13.5 nm.

Then, post exposure baking was conducted at 110° C. for 90 seconds.

After the post exposure baking, development was conducted at 23° C. for 60 seconds using a developing solution consisting of 2.38% by weight aqueous solution of TMAH, followed by rinsing with pure water and drying.

Thereafter, the film thickness of the remaining resist film was measured using Nanospec (trade name) manufactured by Nanometrics.

The above operation was repeatedly conducted by changing the exposure dose. The exposure dose at which the thickness of the remaining resist film becomes zero is defined as the Eth sensitivity, and evaluation was made by comparison of this Eth sensitivity.

TABLE 1

| | EUV process |
|---|---|
| | Eth sensitivity |
| Example 1 | 1.1 mJ/cm² |
| Example 2 | 2.0 mJ/cm² |
| Comparative Example 1 | 3.8 mJ/cm² |

As is apparent from the results of Table 1 above, it was found that in the examples of the present invention, the sensitivity was higher than the comparative example.

INDUSTRIAL APPLICABILITY

The resist composition and method for forming a resist pattern according to the present invention can be suitably used as a resist composition and method for forming a resist pattern for use in lithography using electron beam (EB) or extreme ultraviolet (EUV).

The invention claimed is:

1. A method for forming a resist pattern, comprising:
applying a resist composition to a substrate, wherein said resist composition comprises a resin component (A) which exhibits changed alkali solubility under action of acid, and an acid generator component (B) that generates acid on exposure, wherein said component (A) comprises a copolymer having a structural unit (a1) represented by general formula (I) shown below, a structural unit (a2) represented by general formula (II) shown below, and a structural unit (a4) represented by general formula (IV) shown below:

[Chemical Formula 3]

wherein R represents a hydrogen atom;

[Chemical Formula 4]

wherein R represents a hydrogen atom, and R' represents an acid dissociable, dissolution inhibiting group; and

[Chemical Formula 5]

wherein R represents a hydrogen atom, R⁴ represents a lower alkyl group, and n represents 0 or an integer of 1 to 3, and wherein said component (B) comprises at least one sulfonium compound selected from the group consisting of sulfonium compounds represented by general formula (b-1) or (b-2) shown below:

[Chemical Formula 2]

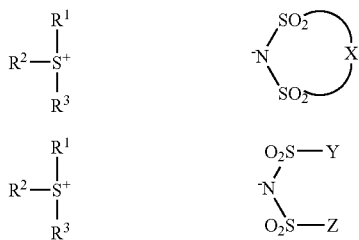

(b-1)

(b-2)

wherein X represents an alkylene group having 2 to 6 carbon atoms, in which at least one hydrogen atom is substituted with a fluorine atom; each of Y and Z independently represents an alkyl group having 1 to 10 atoms, in which at least one hydrogen atom is substituted with a fluorine atom; each of $R^1$ to $R^3$ independently represents an alkyl group or an aryl group including or not including a substituent, with the proviso that at least one of $R^1$ to $R^3$ is an aryl group;

prebaking;

conducting selective exposure or direct patterning with electron beam or extreme ultraviolet (EUV);

conducting post-exposure baking (PEB); and performing alkali developing to form a resist pattern.

* * * * *